(12) United States Patent
Fujino et al.

(10) Patent No.: US 9,577,216 B2
(45) Date of Patent: Feb. 21, 2017

(54) OLED DISPLAY DEVICE, NON-CONTACT IC CARD AND FLEXIBLE DISPLAY DEVICE

(71) Applicant: BOE TECHNOLOGY GROUP CO., LTD., Beijing (CN)

(72) Inventors: Seiji Fujino, Beijing (CN); Guodong Huang, Beijing (CN); Xiaohu Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 25 days.

(21) Appl. No.: 14/646,145

(22) PCT Filed: Oct. 24, 2014

(86) PCT No.: PCT/CN2014/089434
§ 371 (c)(1),
(2) Date: May 20, 2015

(87) PCT Pub. No.: WO2015/196674
PCT Pub. Date: Dec. 30, 2015

(65) Prior Publication Data
US 2016/0301030 A1 Oct. 13, 2016

(30) Foreign Application Priority Data
Jun. 25, 2014 (CN) .................... 2014 2 0346192 U

(51) Int. Cl.
*H01L 51/52* (2006.01)
*H01L 27/32* (2006.01)
(Continued)

(52) U.S. Cl.
CPC .......... *H01L 51/5253* (2013.01); *H01L 23/66* (2013.01); *H01L 25/167* (2013.01);
(Continued)

(58) Field of Classification Search
CPC . H01L 51/5253; H01L 23/66; H01L 27/3288; H01L 25/167; H01L 27/3276;
(Continued)

(56) References Cited

U.S. PATENT DOCUMENTS

2003/0207500 A1* 11/2003 Pichler ................ H01L 51/5259
438/127
2006/0055864 A1* 3/2006 Matsumura ........... G02F 1/1362
349/187
(Continued)

FOREIGN PATENT DOCUMENTS

CN 102751308 A 10/2012
JP 2003084684 A 3/2003

OTHER PUBLICATIONS

International Search Report and Written Opinion mailed Mar. 16, 2015 regarding PCT/CN2014/089434. Translation provided by Dragon Intellectual Property Law Firm.

*Primary Examiner* — Donald Raleigh
(74) *Attorney, Agent, or Firm* — Harness, Dickey & Pierce, P.L.C.

(57) ABSTRACT

The present disclosure relates to the field of organic electroluminescence and provides an OLED display device, a non-contact IC card and a flexible display device. The OLED display device includes a substrate, an encapsulation structure arranged above the substrate, and an OLED arranged between the substrate and the encapsulation structure. A region where an integrated circuit of the display device is bonded is arranged between the substrate and the OLED.

17 Claims, 2 Drawing Sheets

(51) Int. Cl.
*H01L 23/66* (2006.01)
*H01L 25/16* (2006.01)

(52) U.S. Cl.
CPC .......... *H01L 27/32* (2013.01); *H01L 27/3225* (2013.01); *H01L 27/3276* (2013.01); *H01L 27/3288* (2013.01); *H01L 51/52* (2013.01); *H01L 51/5246* (2013.01); *H01L 2223/6677* (2013.01); *H01L 2251/5338* (2013.01)

(58) Field of Classification Search
CPC ......... H01L 27/3225; H01L 2251/5338; H01L 2223/6677
See application file for complete search history.

(56) References Cited

U.S. PATENT DOCUMENTS

| | | | |
|---|---|---|---|
| 2012/0242610 A1* | 9/2012 | Yasumatsu | G06F 3/045 345/173 |
| 2012/0319123 A1 | 12/2012 | Han et al. | |
| 2015/0228705 A1* | 8/2015 | Kim | H01L 27/3248 257/40 |

* cited by examiner

OLED DISPLAY DEVICE, NON-CONTACT IC CARD AND FLEXIBLE DISPLAY DEVICE

CROSS-REFERENCE TO RELATED APPLICATION

The present application is the U.S. national phase of PCT Application No. PCT/CN2014/089434 filed on Oct. 24, 2014, which claims a priority of the Chinese patent application No. 201420346192.7 filed on Jun. 25, 2014, the disclosures of which are incorporated in their entirety by reference herein.

TECHNICAL FIELD

The present disclosure relates to the field of organic electroluminescence, in particular to an OLED display device, a non-contact IC card and a flexible display device.

BACKGROUND

The principle of organic electroluminescence lies in that a cathode layer and an anode layer are arranged at both sides of a light-emitting layer made of an organic material, and the organic material of the light-emitting layer will emit light when a voltage is applied across the cathode layer and the anode layer and a current flows through the light-emitting layer. An organic light-emitting diode (OLED) has been developed on the basis of this principle. As compared with a traditional liquid crystal display device, the OLED has such advantages as small size, simple manufacturing process, fully-cured light-emitting material, and flexibility, thus it has been widely used in display and lighting.

An existing OLED display device includes, apart from the anode layer, the light-emitting layer and the cathode layer, an insulating layer and an isolation column layer, so as to divide the light-emitting layer into a plurality of small light-emitting points, i.e., pixel points. The different pixel points emit light as required, so as to form an image. For the OLED, a region having the light-emitting layer is called as a light-emitting region, and a current flows towards the light-emitting region via a lead outside the light-emitting region. A region where the leads are lapped onto the light-emitting region is called as a lapping region.

FIG. 1 is a schematic view showing the exiting OLED display device. It includes a substrate and regions located on the substrate, i.e., a display region A consisting of an array of the light-emitting points and at which the anodes are arranged in a row direction while the cathodes are arranged in a column direction, first lead regions B1 and B2 arranged at either sides of the display region A and corresponding to the cathodes in odd-numbered rows and in even-numbered rows, respectively, a first lead region D arranged at a lower side of the display region and connected to the anodes of the display region, and an integrated circuit (IC) region C where the first lead regions B1, B2 and D are converged. As shown in FIG. 1, there are the first lead regions and the IC region around the display region A, and these regions will occupy a display area of the display device, so the OLED display device has a wide frame.

SUMMARY

An object of the present disclosure is to provide an OLED display device, a non-contact IC card and a flexible display device, so as to provide the OLED display device with a narrow frame.

In one aspect, the present disclosure provides in embodiments an OLED display device, including a substrate, an encapsulation structure arranged above the substrate, and an OLED arranged between the substrate and the encapsulation structure, wherein a region where an integrated circuit of the display device is bonded is arranged between the substrate and the OLED.

Further, a first lead region is arranged between the OLED and the substrate, a first insulating layer having a first via-hole is arranged between the first lead region and the substrate, and a lead from the first lead region is connected to the integrated circuit through the first via-hole.

Further, a second insulating layer having a second via-hole, an electrode layer and a second lead region having a third via-hole are arranged between the first lead region and the OLED, and a lead from the first lead region is connected to a cathode and an anode of the OLED through the second via-hole and the third via-hole.

Further, the first lead region is provided with an antenna for receiving an external data signal.

Further, the encapsulation structure includes:
a planarization film arranged on the OLED;
an encapsulation thin film arranged on the planarization film; and
a transparent substrate arranged on the encapsulation thin film.

Further, the integrated circuit is arranged on the substrate, the first insulating layer is arranged on the integrated circuit, the first lead region is arranged on the first insulating layer, the second insulating layer is arranged on the first lead region, the second lead region and the electrode region are arranged on the second insulating layer, the OLED is arranged on the second lead region and the electrode layer, and the encapsulation structure is arranged on the OLED.

Further, an edge of the OLED is separated from an edge of the substrate in a horizontal direction at a distance of 0.5 mm to 1.5 mm.

Further, one or more of a memory, a Bluetooth module, a global positioning system (GPS) module, a micro-electro-mechanical system (MEMS) module and a frequency modulation (FM) module is arranged between the substrate and the first insulating layer, and connected to the integrated circuit via a wire.

In another aspect, the present disclosure provides in embodiments a non-contact IC card including the above-mentioned OLED display device.

In yet another aspect, the present disclosure provides in embodiments a flexible display device including the above-mentioned OLED display device.

The present disclosure has the following advantageous effects. According to embodiments of the present disclosure, the region where the integrated circuit of the OLED display device is bonded is arranged between the substrate and the OLED, so the integrated circuit may be bonded at any region below the display region (region AA) of the OLED display device, without occupying a display area of the display device. As a result, it is able to narrow a frame at a side of the region AA and to maximize the region AA, thereby to provide the OLED display device with a narrow frame.

DETAILED DESCRIPTION

Figure 1:
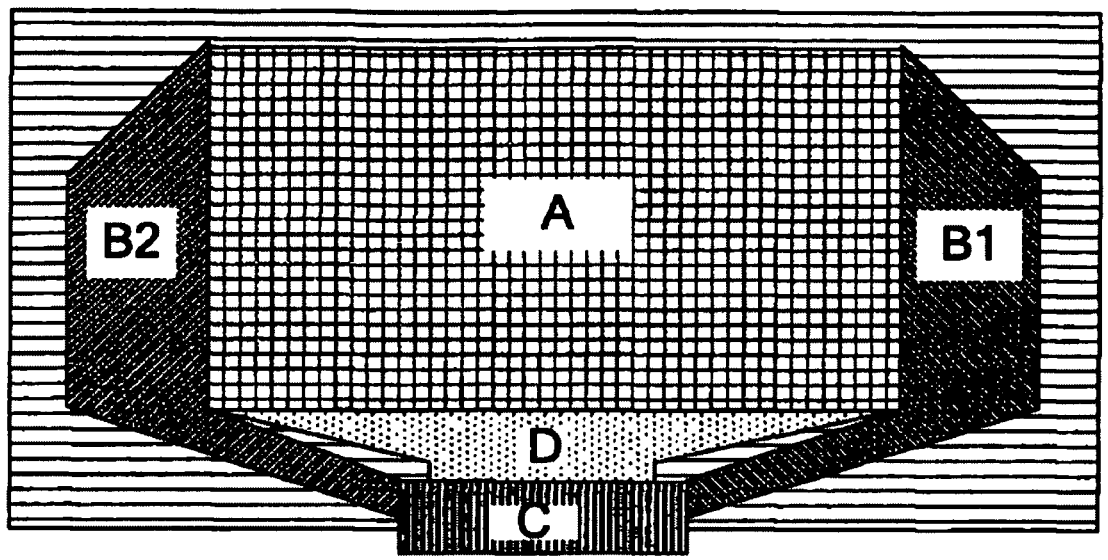
FIG. 1 is a schematic view showing an OLED display device in the related art.

In order to make the objects, the technical solutions and the advantages of the present disclosure more apparent, the present disclosure will be described hereinafter in conjunction with the drawings and embodiments.

The present disclosure provides in following embodiments an OLED display device, a non-contact IC card and a flexible display device, so as to provide the OLED display device with a barrow frame.

The OLED display device in embodiments includes a substrate, an encapsulation structure arranged above the substrate, and an OLED arranged between the substrate and the encapsulation structure, wherein a region where an integrated circuit of the display device is bonded is arranged between the substrate and the OLED.

According to the OLED display device in embodiments of the present disclosure, the region where the integrated circuit of the OLED display device is bonded is arranged between the substrate and the OLED, so the integrated circuit may be bonded at any region below a region AA of the OLED display device, without occupying any display area of the display device. As a result, it is able to narrow a frame at a side of the region AA in FIG. 3 and to maximize the region AA, thereby to provide the OLED display device with a narrow frame.

Further, a first lead region is arranged between the OLED and the substrate, a first insulating layer having a first via-hole is arranged between the first lead region and the substrate, and a lead from the first lead region is connected to the integrated circuit through the first via-hole.

Further, a second insulating layer having a second via-hole, an electrode layer and a second lead region having a third via-hole are arranged between the first lead region and the OLED, and a lead from the first lead region is connected to a cathode and an anode of the OLED through the second via-hole and the third via-hole.

Further, the first lead region is provided with an antenna for receiving an external data signal, and the received external data signal is transmitted to the integrated circuit inside the OLED display device.

Further, the encapsulation structure includes:
a planarization film arranged on the OLED;
an encapsulation thin film arranged on the planarization film; and
a transparent substrate arranged on the encapsulation thin film.

Further, the integrated circuit is arranged on the substrate, the first insulating layer is arranged on the integrated circuit, the first lead region is arranged on the first insulating layer, the second insulating layer is arranged on the first lead region, the second lead region and the electrode region are arranged on the second insulating layer, the OLED is arranged on the second lead region and the electrode layer, and the encapsulation structure is arranged on the OLED.

Further, an edge of the OLED is separated from an edge of the substrate in a horizontal direction at a distance of 0.5 mm to 1.5 mm.

Further, one or more of a memory, a Bluetooth module, a GPS module, an MEMS module and an FM module is arranged between the substrate and the first insulating layer, and connected to the integrated circuit via a wire.

The OLED display device according to embodiments of the present disclosure will be described hereinafter in details in conjunction with the drawings.

Figure 2:
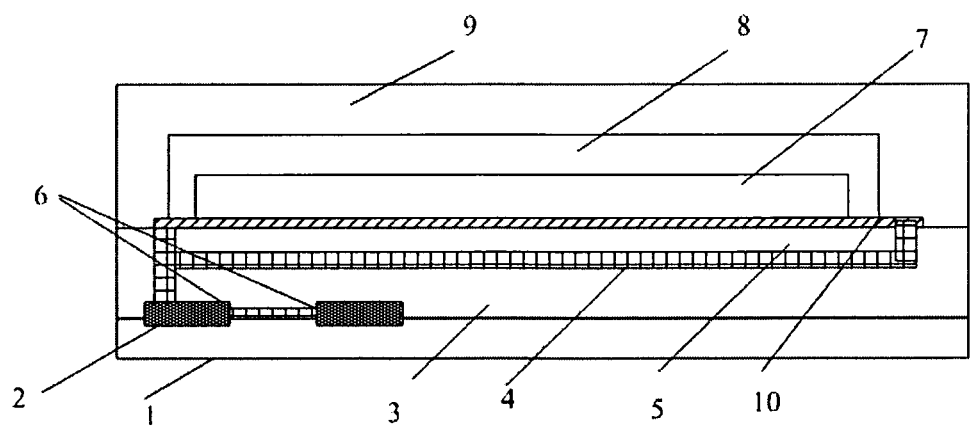
FIG. 2 is a cross-sectional view of an OLED display device according to an embodiment of the present disclosure.

As shown in FIG. 2, the OLED display device includes a substrate 1, an integrated circuit 2 arranged on the substrate 1, a first insulating layer 3 arranged on the integrated circuit 2 and having a first via-hole (not shown), a first lead region 4 arranged on the first insulating layer 3, a second insulating layer 5 arranged on the first lead region 4 and having a second via-hole (not shown), an electrode layer 10 and a second lead region having a third via-hole (not shown) both arranged on the second insulating layer 5, an OLED 7 arranged on the second lead region and the electrode layer 10, and an encapsulation structure arranged on the OLED 7. The encapsulation structure consists of a planarization film, an encapsulation thin film 8 and a transparent substrate 9. For the OLED display device in embodiments of the present disclosure, the OLED 7 is of a top-emitting type, so the transparent substrate is used in the encapsulation structure so as to allow light from the OLED 7 to pass therethrough.

As shown in FIG. 2, the integrated circuit 2 is bonded at a position 6, i.e., the bonding is performed below the display region of the OLED display device, without occupying any display area of the display device. As a result, it is able to narrow a frame at a size of the region AA in FIG. 3 and maximize the region AA, thereby to provide the OLED display device with a narrow frame.

Figure 3:
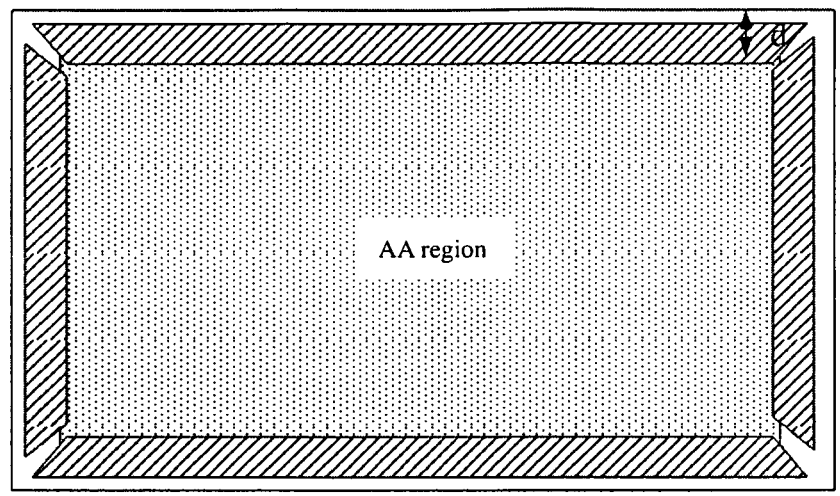
FIG. 3 is a planar view of an OLED display device according to an embodiment of the present disclosure.

Further, in embodiments of the present disclosure, the leads of the OLED display device are also arranged below the display region. The second insulating layer 5, the second lead region and the electrode layer 10 are arranged between the first lead region 4 and the OLED 7, and a lead from the first lead region 4 is connected to an anode and a cathode of the OLED 7 through a second via-hole in the second insulating layer 5 and the third via-hole in the second lead region. The first insulating layer 3 is arranged between the first lead region 4 and the integrated circuit 2, and a lead from the first lead region 4 is connected to the integrated circuit 2 through the first via-hole in the first insulating layer 3. In this way, it is able to further reduce an area of a non-display region. As shown in FIG. 3, an edge of the region AA may be separated from an edge of the entire OLED display device in a horizontal direction at a distance D of 0.5 mm to 1.5 mm.

Further, apart from the integrated circuit 2, a memory, a Bluetooth module, a global positioning system (GPS) module, a micro-electro-mechanical system (MEMS) module and a frequency modulation (FM) module may also be arranged between the substrate 1 and the first insulating layer 3, and connected to the integrated circuit 2 via wires, so as to help the OLED display device to achieve corresponding functions.

Further, the first lead region 4 may be provided with an antenna, so as to achieve communication and provide a wireless power source. In this way, the integrated circuit and the memory inside the OLED display device may be driven without an additional power source.

For the OLED display device in embodiments of the present disclosure, the integrated circuit may be bonded in two ways. One of the ways includes bonding the integrated circuit and the memory onto the substrate 1, and then attaching the substrate 1 with the integrated circuit and the memory onto a structure including the encapsulation thin film, the OLED 7, the second lead region and the electrode layer 10, the second insulating layer 5, the first lead region 4 and the first insulating layer 3. The other includes bonding the integrated circuit and the memory onto the structure including the encapsulation thin film, the OLED 7, the second lead region and the electrode layer 10, the second insulating layer 5, the first lead region 4 and the first insulating layer 3, and then attaching the structure with the integrated circuit and the memory onto the substrate 1.

The present disclosure further provides in embodiments a non-contact IC card including the above-mentioned OLED display device. The non-contact IC card may be used for an ID card, a passport or a credit card.

The present disclosure further provides in embodiments a flexible display device including the above-mentioned OLED display device. The flexible display device may be any product or member having a display function, such as an OLED panel, a mobile phone, a flat-panel computer, a TV, a display, a laptop computer, a digital photo frame and a navigator. Further, the flexible display device may be applied to a wearable device.

The above are merely the preferred embodiments of the present disclosure. It should be appreciated that, a person skilled in the art may make further modifications and improvements without departing from the principle of the present disclosure, and these modifications and improvements shall also fall within the scope of the present disclosure.

What is claimed is:

1. An organic light-emitting diode (OLED) display device, comprising a substrate, an encapsulation structure arranged above the substrate, and an OLED arranged between the substrate and the encapsulation structure,
    wherein a region where an integrated circuit of the display device is bonded is arranged between the substrate and the OLED, and
    wherein a first lead region is arranged between the OLED and the substrate, a first insulating layer having a first via-hole is arranged between the first lead region and the substrate, and a lead from the first lead region is connected to the integrated circuit through the first via-hole.

2. The OLED display device according to claim 1, wherein a second insulating layer having a second via-hole, an electrode layer and a second lead region having a third via-hole are arranged between the first lead region and the OLED, and a lead from the first lead region is connected to a cathode and an anode of the OLED through the second via-hole and the third via-hole.

3. The OLED display device according to claim 2, wherein the first lead region is provided with an antenna for receiving an external data signal.

4. The OLED display device according to claim 3, wherein the encapsulation structure comprises:
    a planarization film arranged on the OLED;
    an encapsulation thin film arranged on the planarization film; and
    a transparent substrate arranged on the encapsulation thin film.

5. The OLED display device according to claim 4, wherein the integrated circuit is arranged on the substrate, the first insulating layer is arranged on the integrated circuit, the first lead region is arranged on the first insulating layer, the second insulating layer is arranged on the first lead region, the second lead region and the electrode region are arranged on the second insulating layer, the OLED is arranged on the second lead region and the electrode layer, and the encapsulation structure is arranged on the OLED.

6. The OLED display device according to claim 1, wherein an edge of the OLED is separated from an edge of the substrate in a horizontal direction at a distance of 0.5 mm to 1.5 mm.

7. The OLED display device according to claim 1, wherein the encapsulation structure comprises:
    a planarization film arranged on the OLED;
    an encapsulation thin film arranged on the planarization film; and
    a transparent substrate arranged on the encapsulation thin film.

8. The OLED display device according to claim 1, wherein one or more of a memory, a Bluetooth module, a global positioning system (GPS) module, a micro-electromechanical system (MEMS) module and a frequency modulation (FM) module is arranged between the substrate and the first insulating layer, and connected to the integrated circuit via a wire.

9. A non-contact IC card comprising the OLED display device according to claim 1.

10. A flexible display device comprising the OLED display device according to claim 1.

11. The OLED display device according to claim 2, wherein the encapsulation structure comprises:
    a planarization film arranged on the OLED;
    an encapsulation thin film arranged on the planarization film; and
    a transparent substrate arranged on the encapsulation thin film.

12. The OLED display device according to claim 2, wherein one or more of a memory, a Bluetooth module, a global positioning system (GPS) module, a micro-electromechanical system (MEMS) module and a frequency modulation (FM) module is arranged between the substrate and the first insulating layer, and connected to the integrated circuit via a wire.

13. The OLED display device according to claim 3, wherein one or more of a memory, a Bluetooth module, a global positioning system (GPS) module, a micro-electromechanical system (MEMS) module and a frequency modulation (FM) module is arranged between the substrate and the first insulating layer, and connected to the integrated circuit via a wire.

14. The OLED display device according to claim 4, wherein one or more of a memory, a Bluetooth module, a global positioning system (GPS) module, a micro-electromechanical system (MEMS) module and a frequency modulation (FM) module is arranged between the substrate and the first insulating layer, and connected to the integrated circuit via a wire.

15. The OLED display device according to claim 5, wherein one or more of a memory, a Bluetooth module, a global positioning system (GPS) module, a micro-electromechanical system (MEMS) module and a frequency modulation (FM) module is arranged between the substrate and the first insulating layer, and connected to the integrated circuit via a wire.

16. The OLED display device according to claim 6, wherein one or more of a memory, a Bluetooth module, a global positioning system (GPS) module, a micro-electromechanical system (MEMS) module and a frequency modulation (FM) module is arranged between the substrate and the first insulating layer, and connected to the integrated circuit via a wire.

17. The OLED display device according to claim 7, wherein one or more of a memory, a Bluetooth module, a global positioning system (GPS) module, a micro-electromechanical system (MEMS) module and a frequency modulation (FM) module is arranged between the substrate and the first insulating layer, and connected to the integrated circuit via a wire.

* * * * *